(12) United States Patent
Chin et al.

(10) Patent No.: US 7,860,597 B2
(45) Date of Patent: Dec. 28, 2010

(54) ATOMIC LAYER DEPOSITION APPARATUS

(75) Inventors: Barry L. Chin, Saratoga, CA (US);
Alfred W. Mak, Union City, CA (US);
Lawrence Chung-Lai Lei, Milpitas, CA (US); Ming Xi, Palo Alto, CA (US);
Hua Chung, San Jose, CA (US); Ken Kaung Lai, Milpitas, CA (US); Jeong Soo Byun, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/646,706

(22) Filed: Dec. 23, 2009

(65) Prior Publication Data

US 2010/0099270 A1  Apr. 22, 2010

Related U.S. Application Data

(63) Continuation of application No. 11/423,535, filed on Jun. 12, 2006, now Pat. No. 7,660,644, which is a continuation of application No. 09/917,842, filed on Jul. 27, 2001, now Pat. No. 7,085,616.

(51) Int. Cl.
*G06F 19/00* (2006.01)
*C23C 16/00* (2006.01)
(52) U.S. Cl. ............... 700/112; 700/120; 700/121; 700/123; 118/715; 118/723 VE; 117/93
(58) Field of Classification Search ................ 700/112, 700/120, 121, 123; 118/715, 723 VE; 117/93
See application file for complete search history.

(56) References Cited

U.S. PATENT DOCUMENTS

| 4,058,430 A | 11/1977 | Suntola et al. |
| 4,389,973 A | 6/1983 | Suntola et al. |
| 4,413,022 A | 11/1983 | Suntola et al. |
| 4,423,701 A | 1/1984 | Nath et al. |
| 4,664,939 A | 5/1987 | Ovshinsky |
| 4,834,831 A | 5/1989 | Nishizawa et al. |
| 4,975,144 A | 12/1990 | Yamazaki et al. |

(Continued)

FOREIGN PATENT DOCUMENTS

DE    103 28 578 A1    2/2004

(Continued)

OTHER PUBLICATIONS

Liu, et al., "Generating Sub-30nm Poly-Silicon Gates Using PECVD Amorphous Carbon as Hardmask and Anti-Reflective Coating", Proceedings of the SPIE, Bellingham, VA, US, vol. 5040, No. 1, Feb. 25, 2003, pp. 841-848.

(Continued)

*Primary Examiner*—Michael D Masinick
(74) *Attorney, Agent, or Firm*—Patterson & Sheridan, LLP

(57) ABSTRACT

A method and apparatus for atomic layer deposition (ALD) is described. The apparatus comprises a deposition chamber and a wafer support. The deposition chamber is divided into two or more deposition regions that are integrally connected one to another. The wafer support is movable between the two or more interconnected deposition regions within the deposition chamber.

19 Claims, 4 Drawing Sheets

U.S. PATENT DOCUMENTS

| | | | |
|---|---|---|---|
| 4,975,252 A | 12/1990 | Nishizawa et al. | |
| 4,993,357 A | 2/1991 | Scholz | |
| 5,022,959 A | 6/1991 | Itoh et al. | |
| 5,225,368 A | 7/1993 | Dodson | |
| 5,261,959 A | 11/1993 | Gasworth | |
| 5,262,262 A | 11/1993 | Yagi et al. | |
| 5,281,274 A | 1/1994 | Yoder | |
| 5,294,286 A | 3/1994 | Nishizawa et al. | |
| 5,338,362 A | 8/1994 | Imahashi | |
| 5,374,570 A | 12/1994 | Nasu et al. | |
| 5,441,012 A * | 8/1995 | Aketagawa et al. | 117/86 |
| 5,441,703 A | 8/1995 | Jurgensen | |
| 5,443,647 A | 8/1995 | Aucoin et al. | |
| 5,461,003 A | 10/1995 | Havemann et al. | |
| 5,480,818 A | 1/1996 | Matsumoto et al. | |
| 5,483,919 A | 1/1996 | Yokoyama et al. | |
| 5,503,875 A | 4/1996 | Imai et al. | |
| 5,518,542 A | 5/1996 | Matsukawa et al. | |
| 5,592,581 A | 1/1997 | Okase | |
| 5,674,573 A | 10/1997 | Mitani et al. | |
| 5,674,786 A | 10/1997 | Turner et al. | |
| 5,711,811 A | 1/1998 | Suntola et al. | |
| 5,730,802 A | 3/1998 | Ishizumi et al. | |
| 5,759,913 A | 6/1998 | Fulford, Jr. et al. | |
| 5,789,320 A | 8/1998 | Andricacos et al. | |
| 5,796,116 A | 8/1998 | Nakata et al. | |
| 5,807,792 A | 9/1998 | Ilg et al. | |
| 5,830,332 A | 11/1998 | Babich et al. | |
| 5,835,677 A | 11/1998 | Li et al. | |
| 5,855,680 A | 1/1999 | Soininen et al. | |
| 5,866,920 A | 2/1999 | Matsumoto et al. | |
| 5,879,459 A | 3/1999 | Gadgil et al. | |
| 5,882,830 A | 3/1999 | Visser et al. | |
| 5,900,288 A | 5/1999 | Kuhman et al. | |
| 5,916,365 A | 6/1999 | Sherman | |
| 5,930,655 A | 7/1999 | Cooney, III et al. | |
| 5,981,000 A | 11/1999 | Grill et al. | |
| 5,986,344 A | 11/1999 | Subramanion et al. | |
| 5,998,100 A | 12/1999 | Azuma et al. | |
| 6,008,140 A | 12/1999 | Ye et al. | |
| 6,015,590 A | 1/2000 | Suntola et al. | |
| 6,030,901 A | 2/2000 | Hopper et al. | |
| 6,035,803 A | 3/2000 | Robles et al. | |
| 6,042,652 A | 3/2000 | Hyun et al. | |
| 6,043,167 A | 3/2000 | Lee et al. | |
| 6,054,379 A | 4/2000 | Yau et al. | |
| 6,057,226 A | 5/2000 | Wong | |
| 6,064,118 A | 5/2000 | Sasaki | |
| 6,066,577 A | 5/2000 | Cooney, III et al. | |
| 6,080,529 A | 6/2000 | Ye et al. | |
| 6,098,568 A | 8/2000 | Raoux et al. | |
| 6,139,700 A | 10/2000 | Kang et al. | |
| 6,140,224 A | 10/2000 | Lin | |
| 6,140,226 A | 10/2000 | Grill et al. | |
| 6,143,476 A | 11/2000 | Ye et al. | |
| 6,153,935 A | 11/2000 | Edelstein et al. | |
| 6,165,890 A | 12/2000 | Kohl et al. | |
| 6,174,377 B1 | 1/2001 | Doering et al. | |
| 6,183,563 B1 | 2/2001 | Choi et al. | |
| 6,183,930 B1 | 2/2001 | Ueda et al. | |
| 6,184,572 B1 | 2/2001 | Mountsier et al. | |
| 6,197,683 B1 | 3/2001 | Kang et al. | |
| 6,200,893 B1 | 3/2001 | Sneh | |
| 6,203,898 B1 | 3/2001 | Kohler et al. | |
| 6,211,065 B1 | 4/2001 | Xi et al. | |
| 6,214,637 B1 | 4/2001 | Kim et al. | |
| 6,214,730 B1 | 4/2001 | Cooney, III et al. | |
| 6,231,672 B1 | 5/2001 | Choi et al. | |
| 6,235,629 B1 | 5/2001 | Takenaka | |
| 6,270,572 B1 | 8/2001 | Kim et al. | |
| 6,291,334 B1 | 9/2001 | Somekh | |
| 6,305,314 B1 | 10/2001 | Sneh et al. | |
| 6,306,216 B1 | 10/2001 | Kim et al. | |
| 6,316,347 B1 | 11/2001 | Chang et al. | |
| 6,323,119 B1 | 11/2001 | Xi et al. | |
| 6,331,380 B1 | 12/2001 | Ye et al. | |
| 6,333,255 B1 | 12/2001 | Sekiguchi | |
| 6,352,922 B1 | 3/2002 | Kim | |
| 6,365,025 B1 | 4/2002 | Ting et al. | |
| 6,387,185 B2 | 5/2002 | Doering et al. | |
| 6,447,607 B2 | 9/2002 | Soininen et al. | |
| 6,478,872 B1 | 11/2002 | Chae et al. | |
| 6,481,945 B1 | 11/2002 | Hasper et al. | |
| 6,497,767 B1 | 12/2002 | Okase et al. | |
| 6,511,539 B1 | 1/2003 | Raaijmakers | |
| 6,551,406 B2 | 4/2003 | Kilpi | |
| 6,572,705 B1 | 6/2003 | Suntola et al. | |
| 6,578,287 B2 | 6/2003 | Aswad | |
| 6,579,372 B2 | 6/2003 | Park | |
| 6,630,030 B1 | 10/2003 | Suntola et al. | |
| 6,630,201 B2 | 10/2003 | Chiang et al. | |
| 6,653,735 B1 | 11/2003 | Yang et al. | |
| 6,660,126 B2 | 12/2003 | Nguyen et al. | |
| 6,716,287 B1 | 4/2004 | Santiago et al. | |
| 6,718,126 B2 | 4/2004 | Lei | |
| 6,723,595 B2 * | 4/2004 | Park | 438/216 |
| 6,734,020 B2 | 5/2004 | Lu et al. | |
| 6,772,072 B2 | 8/2004 | Ganguli et al. | |
| 6,773,507 B2 * | 8/2004 | Jallepally et al. | 117/89 |
| 6,777,352 B2 | 8/2004 | Tepman et al. | |
| 6,778,762 B1 | 8/2004 | Shareef et al. | |
| 6,812,157 B1 | 11/2004 | Gadgil | |
| 6,818,094 B2 | 11/2004 | Yudovsky | |
| 6,821,563 B2 * | 11/2004 | Yudovsky | 427/248.1 |
| 6,866,746 B2 | 3/2005 | Lei et al. | |
| 6,868,859 B2 | 3/2005 | Yudovsky | |
| 6,884,733 B1 | 4/2005 | Dakshina-Murthy et al. | |
| 7,064,724 B2 | 6/2006 | Louzir et al. | |
| 7,079,740 B2 | 7/2006 | Vandroux et al. | |
| 2001/0007788 A1 | 7/2001 | Chang et al. | |
| 2001/0013312 A1 | 8/2001 | Soininen et al. | |
| 2001/0014371 A1 | 8/2001 | Kilpi | |
| 2001/0042523 A1 | 11/2001 | Kesala | |
| 2001/0054377 A1 | 12/2001 | Lindfors et al. | |
| 2002/0000196 A1 | 1/2002 | Park | |
| 2002/0001778 A1 | 1/2002 | Latchford et al. | |
| 2002/0007790 A1 | 1/2002 | Park | |
| 2002/0009544 A1 | 1/2002 | McFeely et al. | |
| 2002/0041931 A1 | 4/2002 | Suntola et al. | |
| 2002/0052097 A1 | 5/2002 | Park | |
| 2002/0066411 A1 | 6/2002 | Chiang et al. | |
| 2002/0073924 A1 | 6/2002 | Chiang et al. | |
| 2002/0076481 A1 | 6/2002 | Chiang et al. | |
| 2002/0076507 A1 | 6/2002 | Chiang et al. | |
| 2002/0076508 A1 | 6/2002 | Chiang et al. | |
| 2002/0086106 A1 | 7/2002 | Park et al. | |
| 2002/0086547 A1 | 7/2002 | Mui et al. | |
| 2002/0090794 A1 | 7/2002 | Chang et al. | |
| 2002/0092471 A1 | 7/2002 | Kang et al. | |
| 2002/0094689 A1 | 7/2002 | Park | |
| 2002/0104481 A1 | 8/2002 | Chiang et al. | |
| 2002/0108570 A1 | 8/2002 | Lindfors | |
| 2002/0121241 A1 | 9/2002 | Nguyen et al. | |
| 2002/0121342 A1 | 9/2002 | Nguyen et al. | |
| 2002/0127745 A1 | 9/2002 | Lu et al. | |
| 2002/0134307 A1 | 9/2002 | Choi | |
| 2002/0144655 A1 | 10/2002 | Chiang et al. | |
| 2002/0144657 A1 | 10/2002 | Chiang et al. | |
| 2002/0146511 A1 * | 10/2002 | Chiang et al. | 427/248.1 |
| 2003/0010451 A1 | 1/2003 | Tzu et al. | |
| 2003/0022338 A1 | 1/2003 | Ruben et al. | |
| 2003/0042630 A1 | 3/2003 | Babcoke et al. | |
| 2003/0053799 A1 | 3/2003 | Lei | |
| 2003/0057527 A1 | 3/2003 | Chung et al. | |

| | | |
|---|---|---|
| 2003/0072913 A1 | 4/2003 | Chou et al. |
| 2003/0075273 A1* | 4/2003 | Kilpela et al. .......... 156/345.33 |
| 2003/0075925 A1 | 4/2003 | Lindfors et al. |
| 2003/0079686 A1 | 5/2003 | Chen et al. |
| 2003/0089308 A1 | 5/2003 | Raaijmakers |
| 2003/0091938 A1 | 5/2003 | Fairbairn et al. |
| 2003/0101927 A1 | 6/2003 | Raaijmakers |
| 2003/0106490 A1 | 6/2003 | Jallepally et al. |
| 2003/0113187 A1 | 6/2003 | Lei et al. |
| 2003/0116087 A1 | 6/2003 | Nguyen et al. |
| 2003/0119307 A1 | 6/2003 | Bekiaris et al. |
| 2003/0121489 A1 | 7/2003 | Rotter et al. |
| 2003/0121608 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0172872 A1* | 9/2003 | Thakur et al. ............... 118/715 |
| 2003/0194493 A1 | 10/2003 | Chang et al. |
| 2003/0198754 A1 | 10/2003 | Xi et al. |
| 2003/0213560 A1 | 11/2003 | Wang et al. |
| 2003/0216981 A1 | 11/2003 | Tillman |
| 2003/0221780 A1 | 12/2003 | Lei et al. |
| 2003/0224107 A1 | 12/2003 | Lindfors et al. |
| 2003/0224723 A1 | 12/2003 | Sun et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0023502 A1 | 2/2004 | Tzou et al. |
| 2004/0025370 A1 | 2/2004 | Guenther |
| 2004/0038537 A1 | 2/2004 | Liu et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0144308 A1 | 7/2004 | Yudovsky |
| 2004/0144311 A1 | 7/2004 | Chen et al. |
| 2004/0166691 A1 | 8/2004 | Nieh et al. |
| 2004/0180551 A1 | 9/2004 | Biles et al. |
| 2004/0229470 A1 | 11/2004 | Rui et al. |
| 2005/0006799 A1 | 1/2005 | Gregg et al. |
| 2005/0019585 A1 | 1/2005 | Kashiwagi et al. |
| 2005/0202683 A1 | 9/2005 | Wang et al. |
| 2005/0287771 A1 | 12/2005 | Seamons et al. |

FOREIGN PATENT DOCUMENTS

| | | |
|---|---|---|
| EP | 381109 A2 | 8/1990 |
| EP | 901156 A2 | 3/1999 |
| EP | 1167569 A1 | 1/2002 |
| JP | 58098917 | 6/1983 |
| JP | 4291916 A | 10/1992 |
| JP | 5047668 A | 2/1993 |
| JP | 5206036 A | 8/1993 |
| JP | 5234899 A | 9/1993 |
| JP | 05270987 A | 10/1993 |
| JP | 6224138 A | 8/1994 |
| JP | 09045633 A | 2/1997 |
| JP | 11026578 A | 1/1999 |
| JP | 2000212752 | 8/2000 |
| JP | 2000319772 | 11/2000 |
| JP | 2001020075 | 1/2001 |
| WO | WO-9617107 A1 | 6/1996 |
| WO | WO-9901595 A1 | 1/1999 |
| WO | WO-9965064 A1 | 12/1999 |
| WO | WO-00/05763 A1 | 2/2000 |
| WO | WO-0054320 A1 | 9/2000 |
| WO | WO-0079576 A1 | 12/2000 |
| WO | WO-0117692 A1 | 3/2001 |
| WO | WO-0136702 A1 | 5/2001 |
| WO | WO-0208488 A1 | 1/2002 |
| WO | WO-0245871 A1 | 6/2002 |
| WO | WO-03023835 A1 | 3/2003 |

OTHER PUBLICATIONS

PCT Notification of Transmittal of the International Search Report dated May 31, 2005 for PCT/US05/008070.
PCT Written Opinion dated May 31, 2005 for PCT/US05/008070.
PCT International Search Report for PCT/US05/005855 dated Oct. 13, 2005.
PCT Written Opinion for PCT/US05/005855 dated Oct. 13, 2005.
Prosecution history of U.S. Appl. No. 11/423,535 as of Mar. 8, 2010.
Prosecution history of U.S. Appl. No. 09/917,842 as of Mar. 8, 2010.

* cited by examiner

ATOMIC LAYER DEPOSITION APPARATUS

CROSS-REFERENCE TO RELATED APPLICATIONS

This application is a continuation of U.S. patent application Ser. No. 11/423,535, filed Jun. 12, 2006 now U.S. Pat. No. 7,660,644, which is a continuation of U.S. patent application Ser. No. 09/917,842, filed Jul. 27, 2001 now U.S. Pat. No. 7,085,616, which are hereby incorporated by reference in their entireties. Benefit of priority to both applications is claimed.

BACKGROUND OF THE INVENTION

1. Field of the Invention

The present invention relates to integrated circuit processing equipment and, more particularly to atomic layer deposition (ALD) equipment.

2. Description of the Background Art

Semiconductor wafer processing systems that perform atomic layer deposition (ALD) are used to form material layers on high aspect ratio structures. Referring to FIG. 1, ALD systems typically comprise a deposition chamber 10, a gas supply system 12, and a gas exhaust system 14. The deposition chamber includes a pedestal 11 that is used to support a substrate 13 such as a semiconductor wafer. The gas supply system 12 is used to provide reaction gases to the deposition chamber 10, and the gas exhaust system 14 is used to remove reaction gases from the deposition chamber 10.

In ALD processes, a material layer is formed on a substrate by sequentially chemisorbing alternating monolayers of two or more compounds thereon. Each of the alternating monolayers is chemisorbed onto the substrate by providing a different deposition gas to the chamber that comprises one of the two or more compounds used to form the material layer. After each monolayer is chemisorbed on the substrate, a purge gas is introduced into the deposition chamber to flush the deposition gas therefrom.

Since each of the alternating monolayers of the two or more compounds used to form the material layer is chemisorbed onto the substrate by providing a different deposition gas to the chamber followed by a purge gas, atomic layer deposition (ALD) processes are time consuming. As such, integrated circuit fabrication using ALD processes are costly due to decreased wafer throughput.

Therefore, a need exists in the art for atomic layer deposition (ALD) systems for integrated circuit fabrication.

SUMMARY OF THE INVENTION

A method and apparatus for atomic layer deposition (ALD) is described. The apparatus comprises a deposition chamber and a wafer support. The deposition chamber is divided into two or more deposition regions that are integrally connected one to another. The wafer support is movable between the two or more interconnected deposition regions within the deposition chamber.

The atomic layer deposition (ALD) apparatus is compatible with integrated circuit fabrication processes. In one integrated circuit fabrication process, a substrate is positioned on a wafer support in an ALD apparatus comprising two or more integrally connected deposition regions. The wafer support with the substrate thereon is then moved into a first one of the integrally connected deposition regions wherein a first monolayer of a first compound is formed on the surface thereof. After the first monolayer of the first compound of formed on the surface of the substrate the wafer support is moved to a second one of the integrally connected deposition regions wherein a second monolayer of a second compound is formed on the first monolayer of the first compound. Thereafter, alternate monolayers of the first and second compounds are deposited one over the other by moving the wafer support with the substrate thereon between the two or more integrally connected deposition regions until a material layer having a desired thickness is formed on the substrate.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
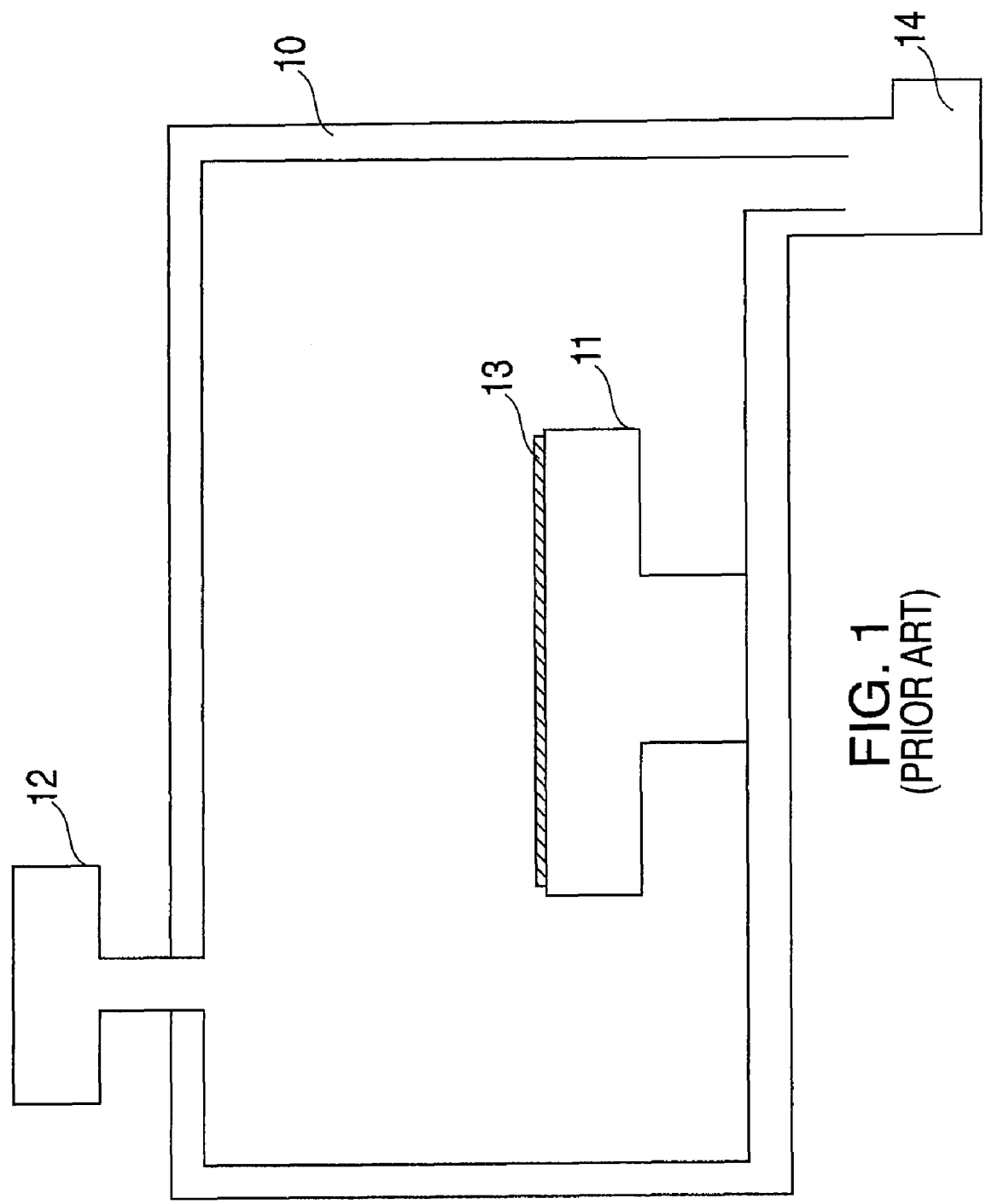
FIG. 1 is a schematic diagram of a prior art atomic layer deposition (ALD) apparatus.
Figure 2:
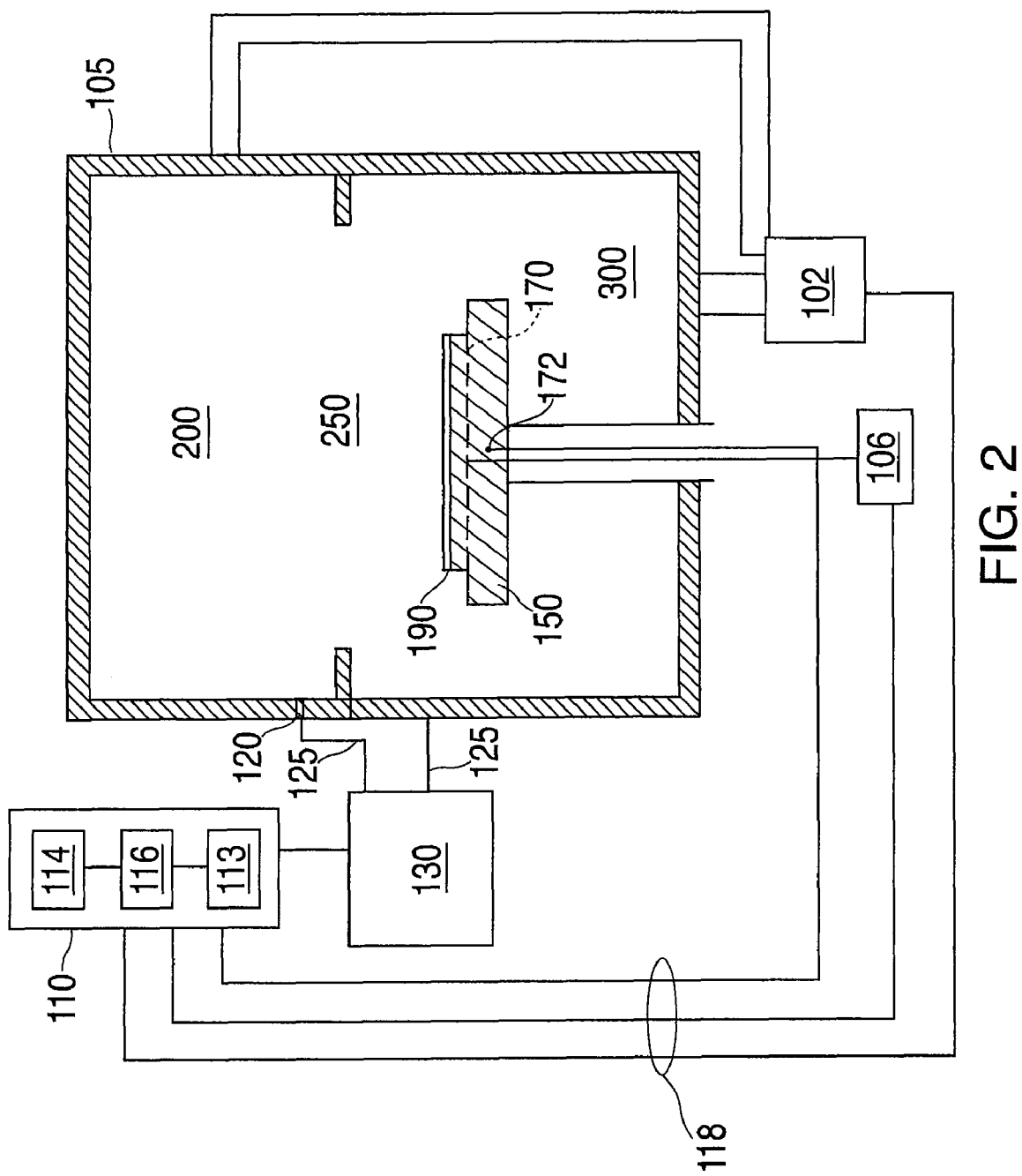
FIG. 2 is a schematic diagram of an atomic layer deposition (ALD) apparatus that can be used for the practice of embodiments described herein.

FIG. 2 is perspective view of an atomic layer deposition (ALD) apparatus 100 that can be used to form a material layer on a semiconductor substrate in accordance with embodiments described herein. The ALD apparatus 100 comprises a deposition chamber 105, a gas panel 130, a control unit 110, along with other hardware components such as power supplies 106 and vacuum pumps 102.

The deposition chamber 105 comprises two or more deposition regions 200, 300 that are integrally connected to each other. In FIG. 2 the two or more deposition regions 200, 300 are configured as one above the other in a vertical arrangement, however it is contemplated that the two or more deposition regions may also be configured in a side by side horizontal arrangement (not shown).

The two or more deposition regions 200, 300 are integrally connected one to another with an aperture 250. The aperture 250 is of a sufficient size to permit the passage therethrough of a wafer support 150 having a substrate thereon.

The aperture 250 is optionally sealed. The aperture is sealed to minimize the intermixing of deposition gases within the two or more deposition regions 200, 300. Physical and/or pressure differences may be used.

Alternatively, an inert gas flow may be used to minimize the intermixing of deposition gases at the aperture 250 between the two or more deposition regions 200, 300. The inert gas flow provides a laminar flow around the area of the aperture 250. The inert gas flow is provided around the area of the aperture 250 through orifices (not shown).

The process chamber 105 houses a wafer support 150, which is used to support a substrate such as a semiconductor wafer 190. The wafer support 150 is moveable inside the chamber 105 between the integrally connected deposition regions 200, 300 using a displacement mechanism (not shown).

Depending on the specific process, the semiconductor wafer 190 can be heated to some desired temperature prior to material layer deposition. For example, wafer support 150 may be heated by an embedded heater element 170. The wafer support 150 may be resistively heated by applying an electric current from an AC power supply 106 to the heater element 170. The wafer 190 is, in turn, heated by the wafer support 190.

A temperature sensor 172, such as a thermocouple, may also be embedded in the wafer support 150 to monitor the temperature of the support in a conventional manner. The measured temperature can be used in a feedback loop to control the power supplied to the heater element 170, such that the wafer temperature can be maintained or controlled at a desired temperature which is suitable for the particular process application. The pedestal may optionally be heated using radiant heat (not shown).

A vacuum pump 102 is used to evacuate each of the deposition regions 200, 300 of the process chamber 105 and to maintain the proper gas flows and pressure inside the chamber 105. Orifices 120 provide process gases to each of the one or more deposition regions 200, 300. Each orifice 120 is connected to a gas panel 130 via a gas line 125, which controls and supplies various gases used in different steps of the deposition sequence.

Proper control and regulation of the gas flows through the gas panel 130 is performed by mass flow controllers (not shown) and the control unit 110. Illustratively, the control unit 110 comprises a central processing unit (CPU) 113, as well as support circuitry 114, and memories containing associated control software 116. The control unit 110 is responsible for automated control of the numerous steps required for wafer processing—such as movement of the wafer support, gas flow control, temperature control, chamber evacuation, and other steps. Bi-directional communications between the control unit 110 and the various components of the ALD 100 are handled through numerous signal cables collectively referred to as signal buses 118, some of which are illustrated in FIG. 2.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

Figure 3:
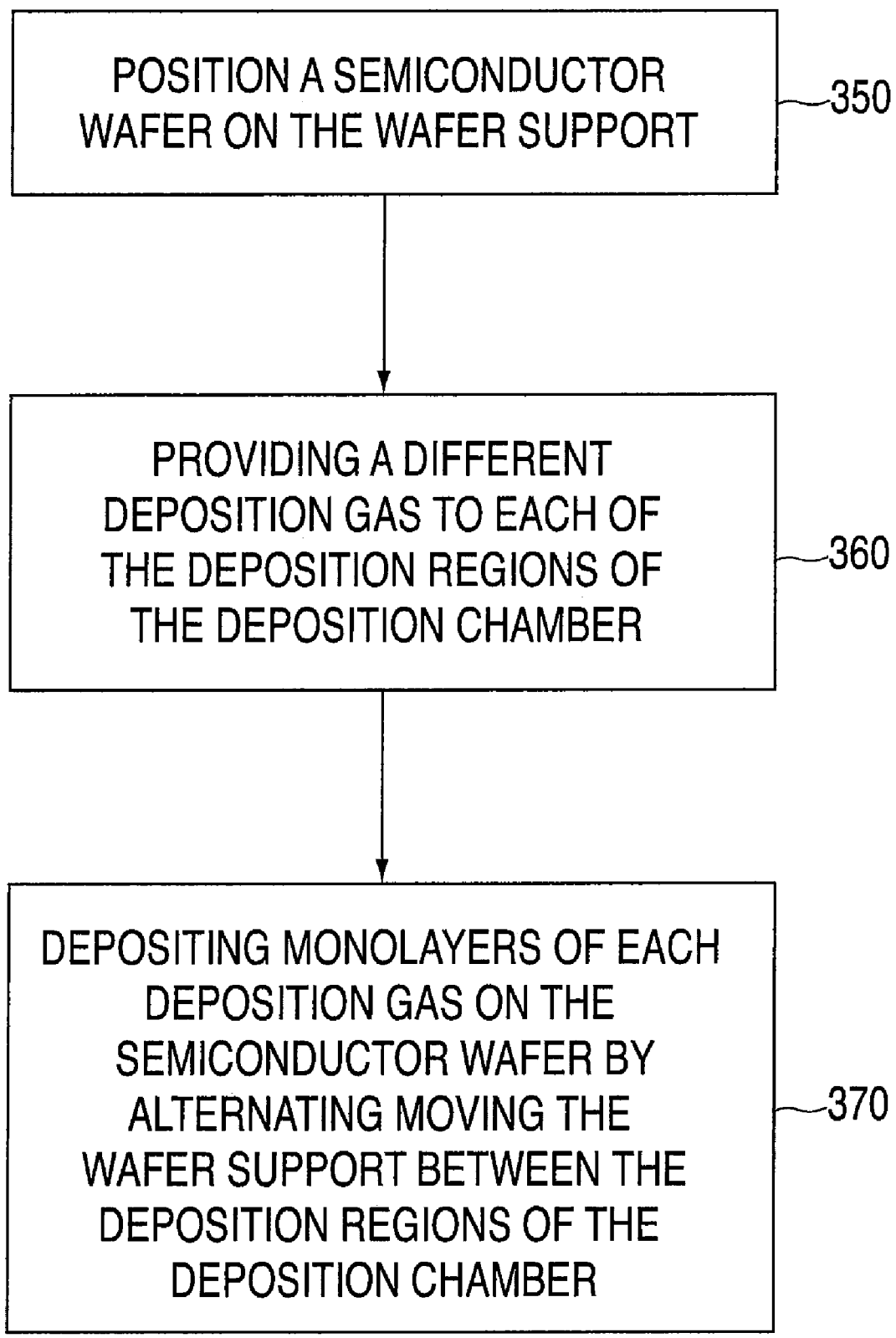
FIG. 3 is a flow diagram of a process sequence for the atomic layer deposition (ALD) apparatus of FIG. 2.
Figure 4:
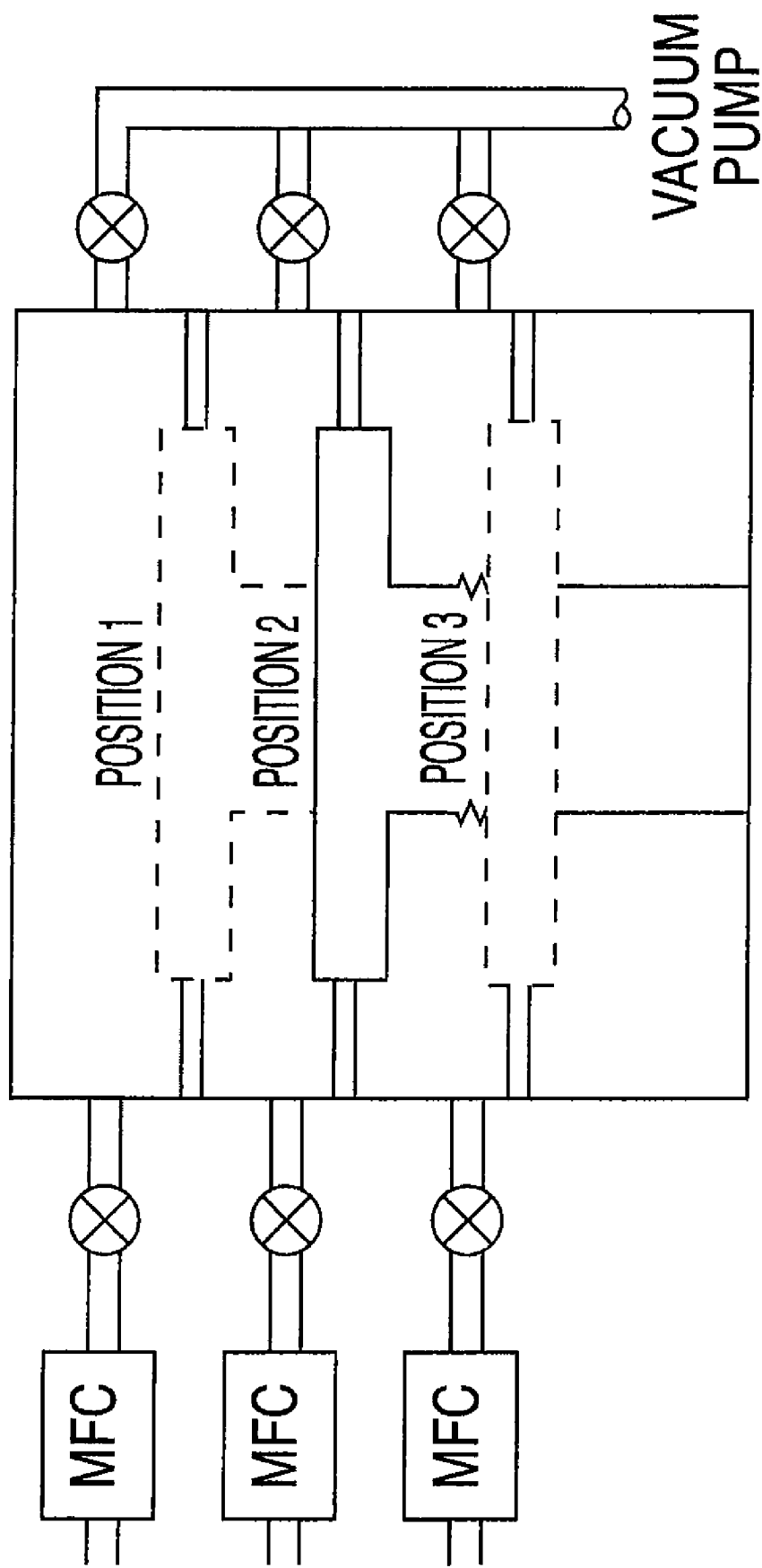
FIG. 4 is a schematic diagram of an atomic layer deposition (ALD) apparatus showing three potential deposition regions.

Referring to FIG. 3, the ALD process sequence begins when a semiconductor wafer is positioned on the wafer support in one of the two or more deposition regions 200, 300 of the deposition chamber 105, as indicated in step 350.

After the semiconductor wafer is positioned on the wafer support, a deposition gas is provided to each of the two or more deposition regions 200, 300, as indicated in step 360 of FIG. 3. A different deposition gas is provided to each of the two or more deposition regions 200, 300. The deposition gases may each be provided using a continuous flow, or optionally using a pulsed flow.

Thereafter as indicated in step 370 of FIG. 3, alternating monolayers of each deposition gas are chemisorbed onto the surface of the semiconductor wafer to form a material layer having a desired thickness thereon. Each monolayer is chemisorbed onto the surface of the semiconductor wafer as the wafer support is alternately moved between the two or more deposition regions through aperture 250.

What is claimed is:

1. An apparatus comprising:
   a vacuum chamber body having a contiguous internal volume comprised of a first deposition region spaced-apart from a second deposition region, the chamber body having a feature operable to minimize intermixing of gases between the first and second deposition regions;
   a first gas port formed in the chamber body positioned to provide gas preferentially to the first deposition region; and
   a second gas port formed in the chamber body positioned to simultaneously provide gas preferentially to the second deposition region.

2. A method of depositing a material layer on a substrate comprising:
   (a) positioning a substrate on a wafer support in a deposition chamber comprising a first deposition region and a second deposition region, wherein the first and second deposition regions are integrally connected to one another, and wherein the wafer support is movable between the first and second deposition regions;
   (b) introducing a first deposition gas into the first deposition region and simultaneously introducing a second deposition gas into the second deposition region;
   (c) moving the wafer support with the substrate thereon into the first deposition region wherein a first monolayer of the first deposition gas is chemisorbed onto the surface of the substrate;
   (d) moving the wafer support with the substrate thereon into the second deposition region wherein a first monolayer of the second deposition gas is chemisorbed on the first monolayer of the first deposition gas; and
   (e) repeating steps (c) and (d) until a material layer having a desired thickness is achieved.

3. The method of claim 2, wherein step (c) further comprises:
   moving the substrate support vertically.

4. The method of claim 2, wherein step (c) further comprises:
   moving the substrate support horizontally.

5. The method of claim 2 further comprising:
   flowing an inert gas between the deposition regions.

6. The apparatus of claim 1 further comprising:
   a substrate support disposed in the internal volume of the chamber body and movable to a first position in the first deposition region adjacent the first gas port and a second position in the second deposition region adjacent the second gas port.

7. The apparatus of claim 1 further comprising:
   a means for moving a substrate disposed in the internal volume of the chamber body between a first position in the first deposition region adjacent the first gas port and a second position in the second deposition region adjacent the second gas port.

8. A method of depositing a material layer on a substrate comprising:
   exposing a substrate positioned in a first deposition region of a deposition chamber to a first deposition gas, a first monolayer of the first deposition gas is chemisorbed onto the surface of the substrate;
   moving the substrate having the first monolayer chemisorbed thereon from the first deposition region to a second region of the deposition chamber; and exposing the substrate positioned in a second deposition region of the deposition chamber to a second deposition gas, wherein a first monolayer of the second deposition gas is chemisorbed on the first monolayer of the first deposition gas, wherein the first and second deposition gases are introduced simultaneously into the deposition chamber.

9. The method of claim 8 further comprising:
cyclically exposing the substrate to first and second deposition gases until a material layer having a desired thickness is formed.

10. The method of claim 9 further wherein cyclically exposing the substrate to first and second deposition gases further comprises:
cyclically moving the substrate between the first second deposition region for exposure to the first deposition gas and second deposition region for exposure to the second deposition gas.

11. The method of claim 8, wherein moving the substrate from the first deposition region to the second region further comprises:
moving the substrate vertically.

12. The method of claim 8, wherein moving the substrate from the first deposition region to the second region further comprises:
moving the substrate horizontally.

13. The method of claim 8 further comprising:
flowing an inert gas between the first and second deposition regions.

14. The method of claim 8 further comprising:
regulating pressure within first deposition region independently from pressure regulated within second deposition region.

15. The method of claim 8 further comprising:
proving laminar flow of gas around an aperture separating the first and second deposition regions.

16. The method of claim 8, wherein moving the substrate from the first deposition region to the second region further comprises:
passing the substrate through a sealable aperture separating the first and second deposition regions.

17. The method of claim 8, wherein moving the substrate from the first deposition region to the second region further comprises:
moving a substrate support having the substrate disposed thereon from the first deposition region to the second deposition region.

18. The method of claim 17, wherein moving the substrate from the first deposition region to the second region further comprises:
moving a substrate support having the substrate disposed thereon through a sealable aperture separating the first and second deposition regions.

19. The method of claim 17, wherein moving the substrate from the first deposition region to the second region further comprises:
moving a substrate support having the substrate disposed thereon through a laminar flow of inert gas.

* * * * *